United States Patent
Roehrig et al.

(10) Patent No.: US 9,738,029 B2
(45) Date of Patent: Aug. 22, 2017

(54) PROCESS FOR MANUFACTURING AND USING A MOLDED BODY WITH A SUPERHYDROPHOBIC SURFACE

(71) Applicant: KARLSRUHER INSTITUT FUER TECHNOLOGIE, Karlsruhe (DE)

(72) Inventors: Michael Roehrig, Bad Schoenborn (DE); Hendrik Hoelscher, Weingarten (DE); Marc Schneider, Weigarten (DE); Matthias Worgull, Stutensee (DE); Andreas Hopf, Stuttgart (DE)

(73) Assignee: KARLSRUHER INSTITUT FUER TECHNOLOGIE, Karlsruhe (DE)

( * ) Notice: Subject to any disclaimer, the term of this patent is extended or adjusted under 35 U.S.C. 154(b) by 78 days.

(21) Appl. No.: 14/443,408

(22) PCT Filed: Oct. 24, 2013

(86) PCT No.: PCT/EP2013/003199
§ 371 (c)(1),
(2) Date: May 18, 2015

(87) PCT Pub. No.: WO2014/075761
PCT Pub. Date: May 22, 2014

(65) Prior Publication Data
US 2015/0306813 A1 Oct. 29, 2015

(30) Foreign Application Priority Data

Nov. 19, 2012 (DE) .......... 10 2012 111 089
Sep. 4, 2013 (DE) .......... 10 2013 109 621

(51) Int. Cl.
*B29C 59/00* (2006.01)
*B29C 59/02* (2006.01)
(Continued)

(52) U.S. Cl.
CPC ............ *B29C 59/025* (2013.01); *B01D 17/02* (2013.01); *B01D 17/0202* (2013.01); *B01J 20/26* (2013.01);
(Continued)

(58) Field of Classification Search
None
See application file for complete search history.

(56) References Cited

U.S. PATENT DOCUMENTS

2010/0326922 A1  12/2010  Varanasi et al.
2011/0097534 A1  4/2011   Lee et al.

FOREIGN PATENT DOCUMENTS

DE          2512772 A1    9/1976
DE     102008057346 A1   10/2009
(Continued)

*Primary Examiner* — Chester Barry
(74) *Attorney, Agent, or Firm* — Leydig, Voit & Mayer, Ltd.

(57) ABSTRACT

A method for producing a molded body includes providing a composite including a first plate having a polymer film pressed into its surface, providing a third plate including roughened areas on at least part of one of its surfaces, placing the third plate opposite the polymer film without the third plate touching the composite, heating the third plate to a temperature above the glass transition temperature Tg of the polymer of the polymer film without heating the composite and without the heated third plate coming into contact with the surface of the polymer film, and structuring the surface of the polymer film facing the third plate by a relative movement which removes the third plate from the first plate while the polymer film remains soft and is thus extended lengthwise, thereby forming a modified composite that comprises the molded body.

13 Claims, 7 Drawing Sheets

(51) Int. Cl.
*B08B 17/06* (2006.01)
*B29C 37/00* (2006.01)
*B01D 17/02* (2006.01)
*B81C 1/00* (2006.01)
*B01J 20/26* (2006.01)
*B01J 20/28* (2006.01)
*B01J 20/30* (2006.01)
*B29C 33/38* (2006.01)
*C02F 1/28* (2006.01)
B29K 23/00 (2006.01)
B29K 105/00 (2006.01)
B29L 9/00 (2006.01)
B29L 31/00 (2006.01)

(52) U.S. Cl.
CPC ..... *B01J 20/28042* (2013.01); *B01J 20/3007* (2013.01); *B08B 17/065* (2013.01); *B29C 33/3842* (2013.01); *B29C 37/0053* (2013.01); *B81C 1/00111* (2013.01); *C02F 1/285* (2013.01); *B29C 2059/023* (2013.01); *B29K 2023/12* (2013.01); *B29K 2105/253* (2013.01); *B29K 2995/0093* (2013.01); *B29L 2009/00* (2013.01); *B29L 2031/772* (2013.01)

(56) References Cited

FOREIGN PATENT DOCUMENTS

| | | |
|---|---|---|
| DE | 102008053619 A1 | 5/2010 |
| WO | WO 2012024099 A1 | 2/2012 |
| WO | WO 2012058090 A1 | 5/2012 |

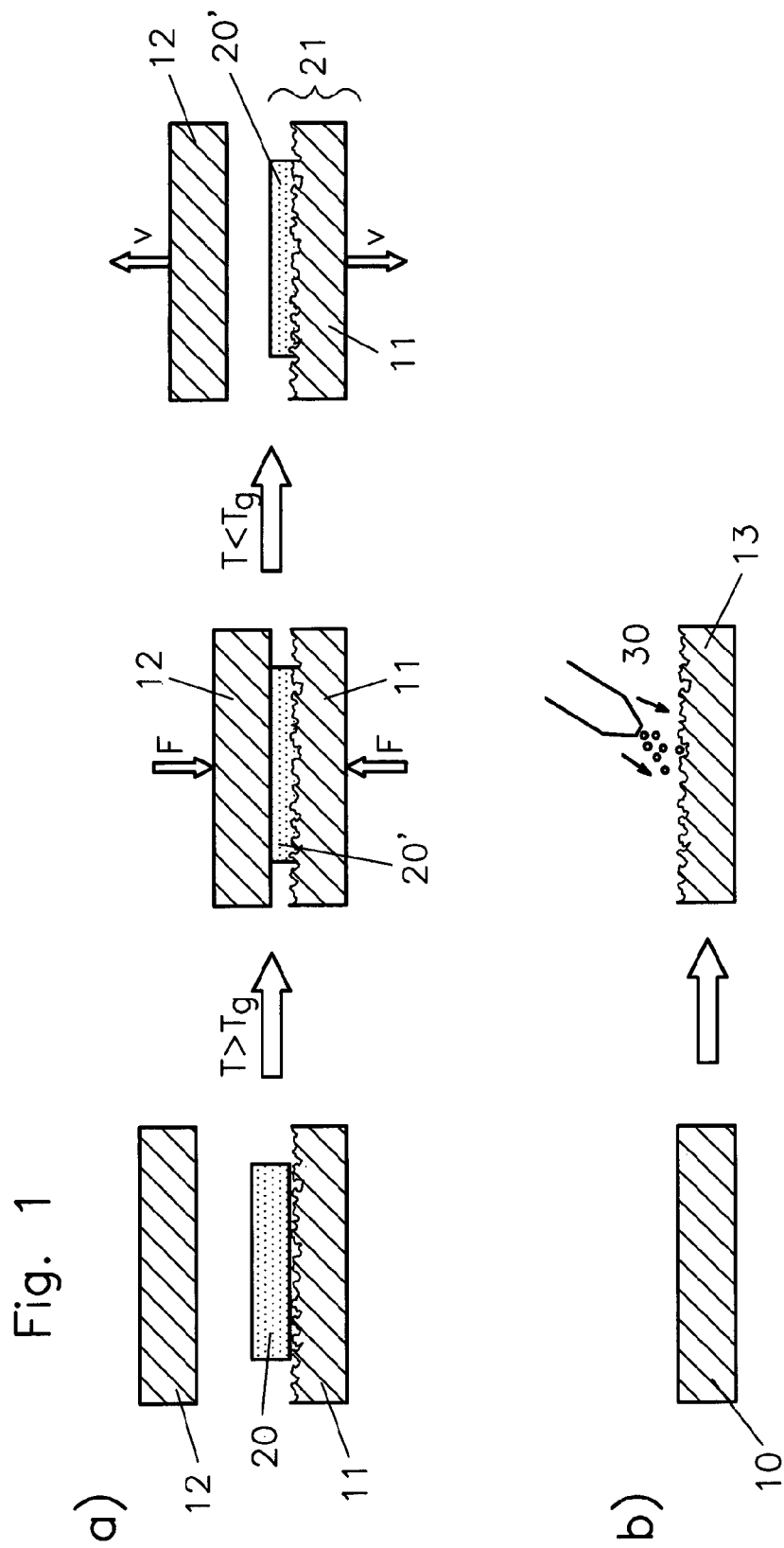

| liquid | $\gamma_{lv}$ (mN/m) | $\gamma^d_{LV}$ (mN/m) | $\gamma^p_{LV}$ (mN/m) | p |
|---|---|---|---|---|
| n-Hexadecane (Jasper, 1972) | 27,5 | 27,5 | 0,0 | 0,00 |
| Diiodmethane (Owens, 1969) | 50,8 | 49,5 | 1,3 | 0,03 |
| Thiodiglycol (Jie-Rong, 1997) | 54,0 | 39,2 | 14,8 | 0,27 |
| Water (Jie-Rong, 1997) | 72,8 | 29,1 | 43,7 | 0,6 |

PROCESS FOR MANUFACTURING AND USING A MOLDED BODY WITH A SUPERHYDROPHOBIC SURFACE

CROSS-REFERENCE TO RELATED APPLICATIONS

This application is a U.S. National Phase application under 35 U.S.C. §371 of International Application No. PCT/EP2013/003199 (WO 2014/075761 A1), filed on Oct. 24, 2013, and claims benefit to German Patent Application Nos. DE 10 2012 111 089.1, filed on Nov. 19, 2012, and DE 10 2013 109 621.2, filed on Sep. 4, 2013.

FIELD

The invention relates to a molded body and a process for manufacturing the same, and specifically to a molded body for use in separating a nonpolar liquid from a polar liquid and a process for manufacturing the same.

BACKGROUND

The question of the wettability of a surface by water forms the basis for a large number of technical solutions in the areas of seals, self-cleaning surfaces and drinking water production. Nature has already developed various solutions for this purpose, which are frequently the result of a structuring or a selected chemical composition of the natural surface.

One of the most well-known examples of this is the lotus plant, whose leaves, according to W. Barthlott and C. Neinhuis, *Purity of the sacred lotus, or escape from contamination in biological surfaces*, Planta 202, 1 (1997), are studded with micrometer-sized papillae, on which there is an epicuticular wax film. Thanks to a suitable combination of structuring and surface chemistry, the leaves of the lotus plant have a low wettability with water, which is the basis of the well-known self-cleaning ability of the lotus plant.

In their *Fabrication of Superhydrophobic Surfaces with High and Low Adhesion Inspired from Rose Petal*, Langmuir 26(11), 8207 (2010), B. Bhushan and E. K. Her describe a contrary effect in some varieties of rose. These roses have developed a surface on their blossoms, which can store a large amount of water. Although, similarly to those of the lotus plant, these surfaces are coated with a fine wax film, the different arrangement of the underlying microstructure, however, results in the water droplets effectively adhering to the rose petals.

According to A. R. Parker and C. R. Lawrence, *Water capture by a desert beetle*, Nature 414, 33 (2001), the *Onymacris unguicularis* beetle takes advantage of its wettability with water to an exceptional extent. In order to be able to take in sufficient amounts of water in the hot desert, it spreads out its wings, which are covered with micrometer-sized hydrophilic elevations and hydrophobic hollows, into the moist surroundings as the mist rises, whereupon the mist condenses on its wings and forms droplets, which, once they have reached a certain size, run directly into the beetle's mouth.

In order technically to manufacture superhydrophobic surfaces, J. Bekesi, J. J. J. Kaakkunen, W. Michaeli, F. Klaiber, M. Schoengart, J. Ihlemann and P. Simon, *Fast fabrication of super-hydrophobic surfaces on polypropylene by replication of short-pulse laser structured molds*, Appl. Phys. A 99, 691 (2010), utilize an injection molding technique, for which regularly arranged structures are used, the preparation of which requires the creation of a special, expensive mold insert. The elaborate production of a new mold insert is necessary in order to modify the structures or their function. In order to create undercuts, the mold inserts must then be reworked in an additional process step, in particular, using laser ablation. Ultimately, the increase in the contact angle achieved by this means is slight.

DE 10 2008 053 619 A1 discloses a method for the production of a technical molded body. For this purpose, a layer of plastic, which is able to be cured, is introduced between two parallel, thermally conductive plates, pressure is applied between the two panels and both panels are heated so that the layer is heated to a temperature above the glass transition temperature of the plastic. The two plates differ insofar as they have a different adhesive force or degree of roughness on their surface or are heated to two different temperatures. Both plates are then pulled apart while the temperature is maintained, whereby the layer remains adhered to one of the two plates, while an initial large number of filaments forms on the other plate. After the plastic has cured, a substrate is obtained, onto which a large number of initial filaments has been applied, and introduced between two parallel, thermally conductive plates. After pressure is applied and the two plates are heated to a temperature above the glass transition temperature, the two plates are pulled apart while the temperature is maintained, whereby the substrate remains adhered to one of the two plates, while a second large number of filaments forms on the other plate, the underside of which, in each case, is firmly bonded with the surface of each initial filament.

According to U. Fischer et al., *Tabellenbuch Metall* (Book of Metal Tables), 41$^{st}$ revised and amplified edition, Europa-Lehrmittel publishers, Haan-Gruiten (2002), the term roughness describes a form of the surface deviation, caused by deviations in the actual surface (metrologically recordable surface) from the geometrically ideal surface, the nominal form of which can be defined by a drawing. This type of unevenness of a surface height is metrologically recorded and is numerically characterized by means of the parameters of the mean roughness $R_a$ and the averaged roughness depth $R_z$. According to W. Beitz and K.-H. Grote, *Dubbel Taschenbuch fuer den Maschinenbau* (Dubbel Handbook of Engineering), 19$^{th}$ edition, Springer-Verlag Berlin (1997), these roughness parameters are recorded based on the reference surface, which has, as a rule, the shape of the geometric surface and, in terms of its position in space, coincides with the principal direction of the actual surface.

The mean roughness parameter $R_a$ corresponds to the arithmetic mean of the deviation of a measuring point on the surface from the center line. The mean roughness depth parameter $R_z$ is determined by dividing a defined measurement section on the surface of the work piece into seven equally sized individual measurement sections, wherein the evaluation is only made over five of these sections. The difference from the maximum and minimum value is calculated for each of the individual measurement sections and the mean value is then derived from this.

The separation of oil/water emulsions is a major technical challenge. The removal of layers of oil, particularly due to environmental catastrophes on the open sea, is brought into focus again and again.

Essentially, there are three options for the removal of a layer of oil at sea: skimming the oil, accelerating the natural decomposition of the oil by adding dispersants, and incinerating the oil film on the open sea. Adequate disposal of the oil is not possible using the two latter options; skimming the oil is prioritized in Juuso T. Korhonen, Marjo Kettunen, Robin H. A. Ras and Olli Ikkala, *Hydrophobic nanocellulose aero-gels as floating, sustainable, reusable, and recyclable oil absorbents*, ACS Appl. Mater. Interfaces, 3 (6): 1813-1816, 2011. Selective sorbents must be utilized In order to avoid the elaborate processing of the skimmed oil/water mixture. Generally, natural absorbents are called on for this purpose. For example, sawdust, rice straw or cotton are used as natural absorbents. Indeed, these absorb oil, although in very small amounts. Their capability, however, is severely limited by their poor buoyancy and, above all, due to their distinct tendency to absorb water, as A. Venkateswara Rao, Nagaraja D. Hegde and Hiroshi Hirashima, *Absorption and desorption of organic liquids in elastic superhydrophobic silica aerogels*, Journal of Colloid and Interface Science, 305(1):124-132, 2007 shows. As well as their low absorbing capacity, then, the major disadvantage of these hydrophilic absorbents is in that, as well as oil, they also absorb a considerable quantity of water. This necessitates reprocessing the absorbed liquids. Elaborate techniques such as sedimentation, floatation or centrifugation are used in sequence for this purpose. These methods, however, can only separate emulsions above a certain particle size. They can only be utilized to a limited extent for particle sizes under 150 µm. Xinwei Chen, Liang Hong, Yanfang Xu and Zheng Wei Ong, *Ceramic pore channels with inducted carbon nanotubes for removing oil from water*, ACS Applied Materials & Interfaces, 4 (4): 1909-1918, 2012 use complex methods for this, based on carbon nanotubes. Sorbents are required, which repel water and hence selectively absorb oil, in order to avoid a similarly elaborate processing of skimmed liquid.

These types of sorbents are mineral-based. Mineral absorbents such as zeolite or silica foams are first and foremost amphiphilic (hydrophilic and lipophilic). M. O. Adebajo, R. L. Frost, J. T. Kloprogge, O. Carmody and S. Kokot, *Porous materials for oil spill cleanup: A review of synthesis and absorbing properties*, Journal of Porous Materials, 10:159-170, 2003 discuss a suitable treatment, which hydrophobizes these absorbents, whereby the penetration of water into the micropores and nanopores is expected to be prevented. As is generally common for mineral absorbents, however, the following negative characteristics are in opposition to the high oil absorbing capacity: high flammability, high brittleness and a hydrophobicity which cannot be permanently maintained. Should water penetrate the foams, which cannot be prevented during operation in the sea, these absorbents collapse, as a rule, owing to the current and the swell. Other sorbents available on the market and in the research area are synthetic organic absorbents, such as commercially available polypropylene or polyurethane mats, which seem to close this gap. These are primarily characterized by a rapid oil absorption and high degree of oil absorption. The absorption of water is low, but nevertheless exists. On removing these mats from the water, however, one weakness is noticeable: the retention of the oil is severely limited. This results in approximately 50% of the oil collected flowing back into the sea on removing the mats. Thus, the bulk of the available absorbents does not fulfill the required hydrophobicity. Along with oil, water is also absorbed, at times in very large volumes. The selective absorption of oil is not sufficiently guaranteed, either with natural or with mineral absorbents. Under certain circumstances, the absorption of water can even result in the complete destruction of the absorbency due to structural collapse. Here, the organic absorbents have advantages, but their retention capacity is limited. Up to 50% of the absorbed oil is released back into the sea on the removal of the absorbents from the water.

SUMMARY OF THE INVENTION

A method is provided for producing a molded body. The method includes providing a composite, the composite including a first plate having a polymer film pressed into a surface of the first plate, providing a third plate, the third plate including roughened areas on at least part of one or more surfaces thereof, the roughened areas having a mean roughness Ra from 1 µm to 30 µm and an averaged roughness depth Rz from 20 µm to 100 µm, placing the third plate opposite the pressed-in polymer film without the third plate touching the composite, then heating the third plate to a temperature above the glass transition temperature Tg of the polymer of the polymer film without heating the composite and without the heated third plate coming into contact with the surface of the pressed-in polymer film, whereby the polymer of the pressed-in polymer film at least partially penetrates into the roughened areas of the third plate, and structuring the surface of the pressed-in polymer film facing the third plate by a relative movement which removes the third plate from the first plate while the pressed-in polymer film remains soft and is thus extended lengthwise, thereby forming a modified composite that comprises the molded body.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 7 is a chart of surface tension of liquids tested and their dispersive and polar components.

DETAILED DESCRIPTION

Figure 1:
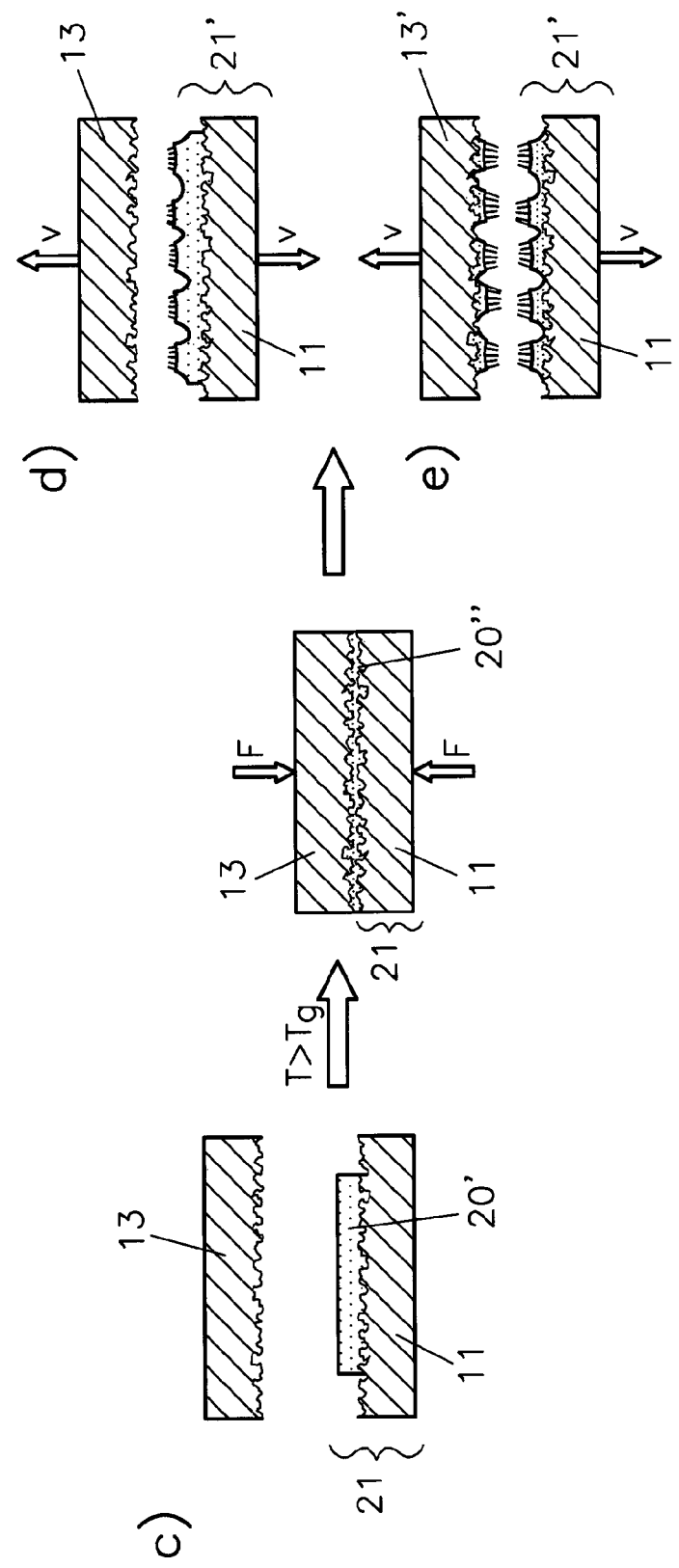
FIG. 1*a*) to *d*) is a schematic representation of process steps according to an embodiment of the invention.

An embodiment of the present invention proposes a molded body and a method for the production of the molded body which do not have the disadvantages and limitations mentioned above.

In particular, an embodiment of the present invention provides a method, with which superhydrophobic surfaces are able to be produced for a large number of technical applications, wherein the type and degree of adhesion of the surface to water are able to be adjusted by means of selected process parameters. In particular, a molded body with superhydrophobic surfaces, which have a broadly entirely water-repellent characteristic and/or which are able to adhere to water drops, can be provided.

In addition, an embodiment of the present invention utilizes a molded body with superhydrophobic characteristics as a separation medium of a nonpolar solution from a polar liquid and, in particular, avoids inadvertently remixing the already separated liquids in the process.

According to an embodiment of the invention, a molded body is produced, which has a superhydrophobic surface consisting of a polymer, which can be obtained by means of a specially developed molding process. The polymer utilized can itself have intrinsic hydrophilic or hydrophobic characteristics. The surface of the molded body according to the invention has a crater structure, with craters with a mean diameter of 2 μm to 250 μm and a height of 1 μm to 500 μm. Polymer filaments with a length of 0.5 μm to 200 μm are formed on their upper edges.

In a first embodiment, the length of the polymer filaments is equivalent to 0.5 times to 10 times the mean diameter of the craters (see FIGS. 2a) and b)). As arose in the trials performed with this, these structures, due to their geometric form, have a broadly entirely water-repellent characteristic and simulate the lotus effect.

In a second embodiment, the length of the polymer filaments is equivalent to 0.01 times to 0.5 times the mean diameter of the craters (see FIG. 2c)). As arose in the trials performed, these structures facilitate no or a high degree of adhesion to the surface of the molded body, in particular, with water, as a function of the concentration of the craters, together with the concentration of the polymer filaments located on the upper edge of the craters. Hence, with a suitable selection of this function, body structures can be formed on the surface of the molded body, which are capable of adhering to water drops.

The molded body can be obtained by a process according to an embodiment of the invention, which incorporates process steps a) to d), described infra.

In a first process step a), a composite is initially prepared between a first plate and a polymer film. Here, a polymer film means an even, extended structure consisting of a polymer, in particular, a thermoplastic polymer (thermoplastic), with a thickness of 1 μm to 10 cm, preferably from 250 μm to 2 mm.

The composite of the first plate and the polymer film is preferably produced for this purpose by initially inserting the polymer film between the first plate and a second plate. In practice, one of the two plates (first plate) always has a higher degree of adhesion to the polymer, while the other of the two plates (second plate) has a lesser degree of adhesion to the polymer, in particular, when this already has a polished or smoothed surface, or by inserting a separating layer between it and the polymer film. In order to create the composite of the polymer film with the first, easily adhering plate, preferably both plates are subsequently heated to a temperature above the glass transition temperature $T_g$ of the polymer contained in the polymer film, wherein the softened polymer is squeezed by applying a compression force on the first plate so that this forms the composite of the polymer film with the first plate; the polymer composite and the opposing plate are then separated.

In a second process step b), a third plate is provided, which has roughened areas with a mean roughness $R_a'$ from 1 μm to 20 μm, preferably from 8 μm to 15 μm, and an averaged roughness depth $R_z'$ from 30 μm to 100 μm, preferably from 40 μm to 50 μm. The required roughened areas are preferably created by exposure to particles, preferably by sandblasting, on at least one side of the third plate.

In a third process step c), which represents the actual remodeling step, the desired structures are created on the surface of the polymer film. In the forming process, the third plate serves as a forming insert plate and is accordingly placed opposite the composite of the first plate and the polymer film created in process step a), without coming into contact with the composite at this stage. Here, the third plate is then heated above the glass transition temperature $T_g$ of the polymer contained in the polymer film, wherein the composite created from the first plate and the polymer film itself is not heated. Should the now hot third plate, in its capacity as a forming insert plate, subsequently come into contact with the polymer film under the effect of the force, the polymer in the polymer film is partially pressed into the existing roughened areas of the third plate.

In a fourth process step d), which represents the demolding process, the other surface of the polymer film facing the third plate is structured by a relative movement between the first plate of the composite and the third plate serving as the forming insert plate, while the polymer film, which is in the composite with the first plate and is therefore also taken along by the relative movement, continues to remain soft during the demolding process, i.e. as long as its temperature is approximately consistent with the glass transition temperature, and is thus extended lengthwise. Thus, the direction of the relative movement is essentially antiparallel to the direction of the effect of the force and perpendicular or oblique relative to the mean surface of the first plate, including the polymer film in the composite with this, and relative to the third plate.

Here, the exact geometric shape of the structures is adjusted by expertly selecting a common set of parameters, which include the following parameters: the temperature, to which the third plate is heated during process step b), the roughness of the third plate, the level of the force, with which the hot third plate comes into contact with the polymer film in its capacity as the forming insert plate during process step b), the dwell time, during which the force acts on the polymer film, and the demolding speed, with which the relative movement between the first plate in the compound and the third plate serving as the forming insert plate takes place.

Figure 2:
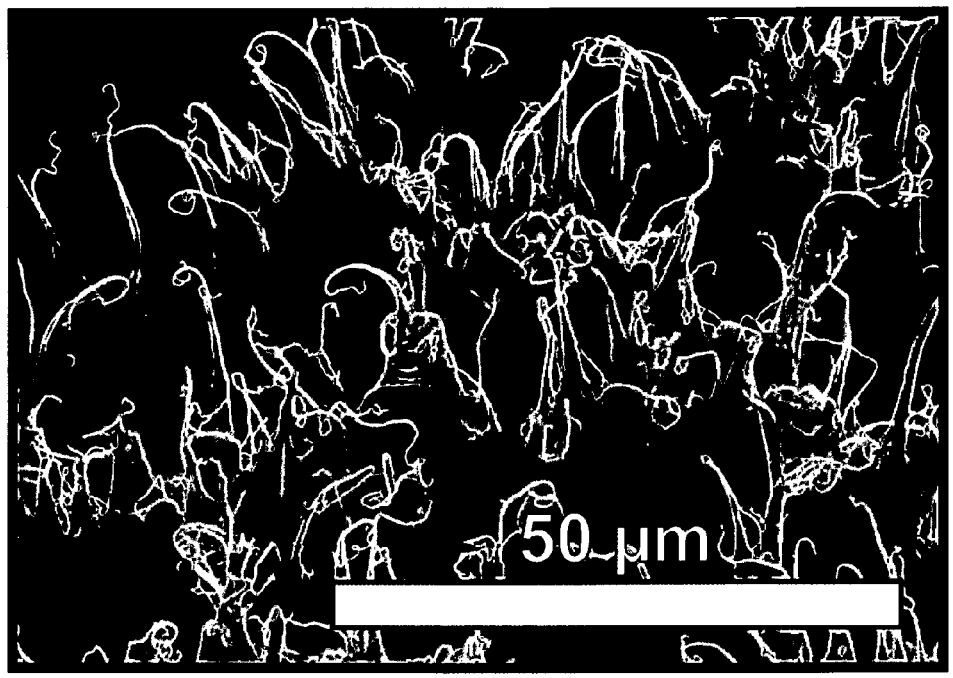
FIGS. 2 *a*) to *d*) depict molded bodies having superhydrophobic surfaces produced using a process according to an embodiment of the invention.
Figure 2:
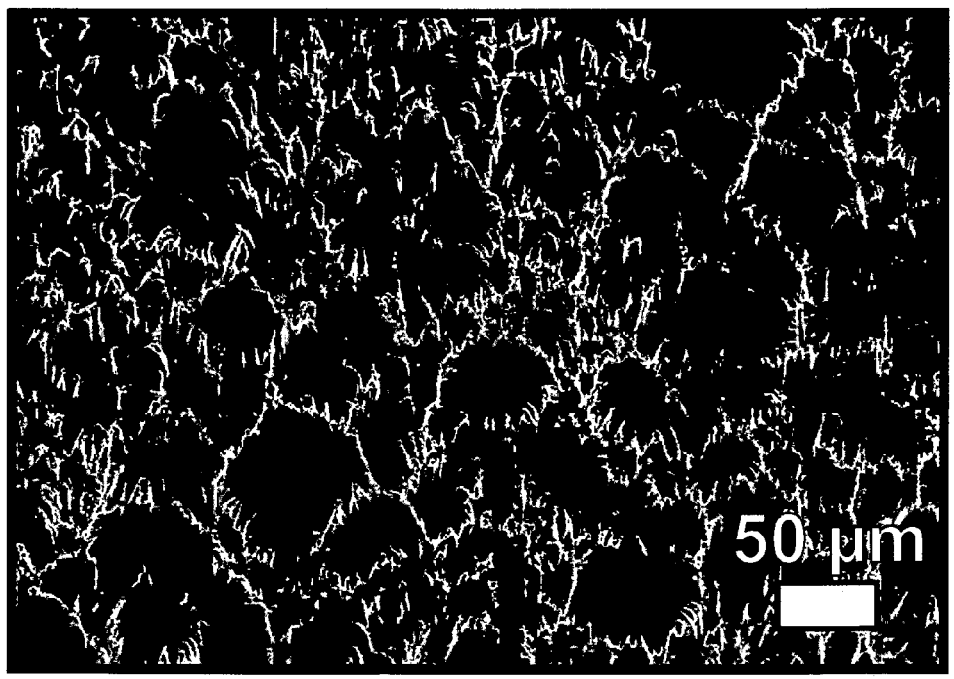
Figure 2:
Figure 2:
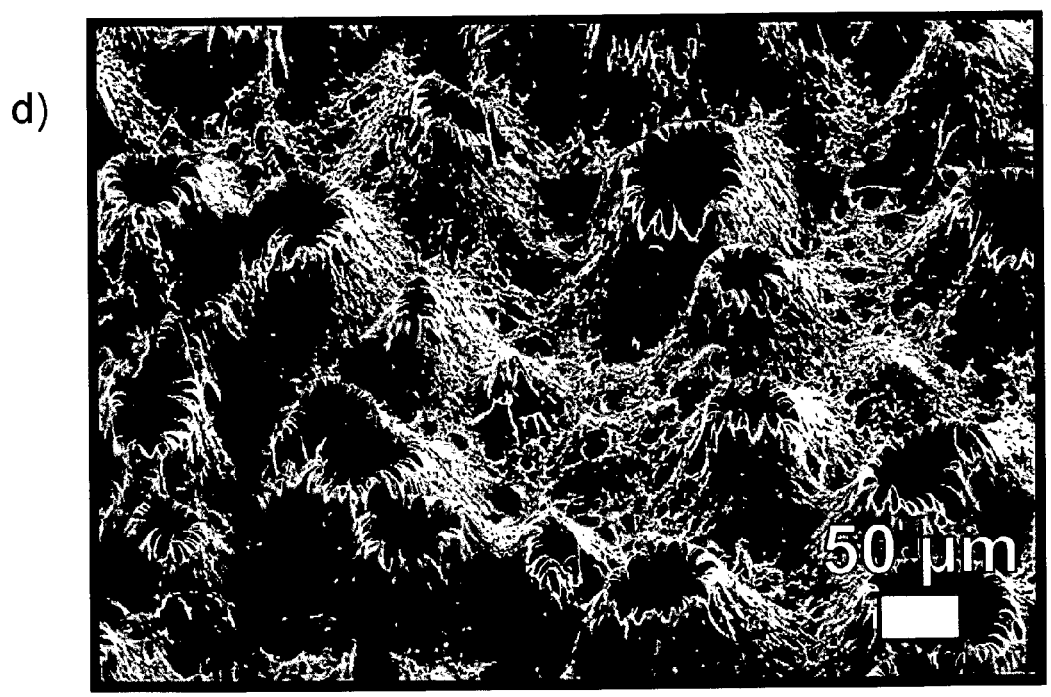

Depending on the parameter set selected, in particular, at a temperature below the melting range of the polymer, the pressed-in polymer film is preferably demolded (extracted) residue-free from the still heated third plate, whereby consistent, fine polymer filaments are drawn (see FIG. 2a), which are arranged in the form of a crater structure (see FIG. 2b). Due to the nature of the geometric shape, these structures simulate the lotus effect.

Where a different set of parameters is selected, in particular, where the temperature is within the melting range of the polymer, demolding the pressed-in polymer film from the still heated third plate results in the polymer film being torn apart, whereby fine craters are created, on the upper edge of which there are very small polymer filaments (see FIG. 2c). These structures facilitate a high degree of adhesion of the molded polymer film, particularly with water, as a function of the concentration of the craters, together with the concentration of the polymer filaments located on the upper edge of the craters.

Where another set of parameters is selected, in particular, where the temperature is between the embodiments described thus far, craters are created on demolding, on the upper edge of which there are longer polymer filaments (see FIG. 2d), which result in a comparatively moderate degree of adhesion of the molded polymer film, particularly with water.

In an alternate embodiment, the first plate and/or second plate and/or third plate utilized in the present process is designed in the form of a roller. This type of embodiment facilitates a substantially higher throughput in the practical performance of the present process.

A molded body formed according to an embodiment of the invention can be used anywhere where surfaces intentionally or unintentionally come into contact with water or moisture or water- or moisture-based materials or oils or oily liquids.

A first area of application is self-cleaning surfaces, which are suitable for a great number of products, particularly for sterile medical devices, laboratory supplies, in the food processing industry, for plastic dishware, storage containers, baking tins and baking paper, for stain-resistant clothing, for self-cleaning roof tiles or for glue containers that can be completely emptied. This area also includes water-resistant surfaces, particularly in seals, as anti-mist, particularly for spectacle lenses, as corrosion protection, by inhibiting the contact of water with the surface and, as water-resistant clothing or as internally structured tubing in order to reduce the friction or to change the flow properties.

A second area of application is air retention, particularly as protection against corrosion under water, as a coating for ship hulls to reduce friction in water, to minimize friction in the water by retaining air in the structures with the objective of saving fuel during the voyage.

A further area of application is water retention, particularly in order to retain condensate, preferably in rooms or aircraft, in order to prevent precipitation of the condensate in passenger areas, as water collecting containers, in children's bibs or diapers. This area also includes drinking water production, particularly so-called water harvesting in accordance with the *Onymacris unguicularis* model mentioned at the beginning, tents, which also draw water from the moist ambient air in dry regions, or irrigation farming.

A further area of application is channel-free microfluidics and lab-on-a-chip systems, with which droplets are conducted in a channel or over a surface by means of hydrophilic and/or hydrophobic regions.

The molded body designed according to the invention is also used as a separation medium of at least one nonpolar liquid and at least one polar liquid. To perform the separation, a molded body is first prepared, which, at least partially, simultaneously has a superhydrophobic and superlipophilic nanostructured surface. Due to its nanostructuring, the surface is more capable of absorbing oil. The molded body with the at least partially superhydrophobic nanostructured surface is then brought into contact with a mixture including at least one nonpolar liquid and at least one polar liquid, which are to be separated. In the process, the nonpolar liquid is taken up by the superhydrophobic nanostructured surface of the molded body. Finally, the molded body with the superhydrophobic nanostructured surface, by which the nonpolar liquid has been at least partially taken up, is removed.

In order to estimate the wettability of a liquid on contact with a surface, the so-called spreading parameter S is determined, which describes the difference between the surface tension of the substrate $y_{SV}$, the surface tension of the liquid $y_{LV}$ and the interfacial surface tension between the substrate and the liquid $y_{SL}$:

$$S = y_{SV} - (y_{LV} + y_{SL})$$

Where the spreading parameter is positive, S>0, the liquid wets the substrate completely and forms a thin film on its surface. If the spreading parameter is negative, the liquid only partially wets the substrate. The smaller the spreading parameter, the greater the wettability of the surface. Contact angles θ of the drops formed of less than 90° imply wettable surfaces, while contact angles greater than 90° correspond to non-wettable surfaces. If θ=90° is used as the limiting condition, then Young's equation gives $y_{SL} = y_{SV}$ and the spreading parameter $S_b$, which represents the boundary between wettability and non-wettability, equals $-y_{LV}$.

If the interfacial surface tensions for the interfacial surfaces between the substrate/gas and between the liquid/gas are known, according to D. K. Owens and R. C. Wendt, *Estimation of the surface free energy of polymers*, Journal of Applied Polymer Science, 13 (8): 1741-1747, 1969, the corresponding interfacial surface tension for the boundary layer between substrate/liquid can be found, wherein d and p stand for dispersed and polar. Thus, it is sufficient to know the surface tension of the substrate and the surface tension of the liquid in order to determine the spreading parameter S and to predict the wettability.

Hence, an extremely hydrophobic surface is defined as superhydrophobic, which is very difficult to wet, i.e. for which the corresponding contact angles of a water drop are greater than 150°.

A surface, which can be completely wet by water is described as superhydrophilic, wherein the spreading parameter is S>0. Analogous to this, a superlipophilic material is lipophilic or has an affinity with oil so that the oil is completely dispersed on the surface, up to complete wetting with at least one monolayer.

In one particular embodiment, the molded body is a film. Adsorbent agents already known are either granules, aerogels, foams or felt-like mats. After its successful separation from water by the method according to the invention, oil is considerably more easily separated from the film and is then disposed of in the same manner as for the known absorbents.

In one particular embodiment, the at least partially superhydrophobic nanostructured surface has a crater structure, wherein filaments are formed on the upper edge of the craters.

The superhydrophobic nanostructured surface of the molded body can absorb the nonpolar liquid, by the latter being absorbed on the nanostructured surface. Thus, the uptake of the liquid is distinguished from an absorption, in which this penetrates the inside of the molded body. The nonpolar liquid is selectively absorbed by the filaments. Due to the high hydrophobicity of the molded body, the liquid collected generally consists of the pure nonpolar liquid. Surprisingly, the molded body according to the invention is simultaneously superlipophilic. The filaments on the upper edge of the craters, then, take up the nonpolar liquid selectively and adhere to it.

Figure 3:
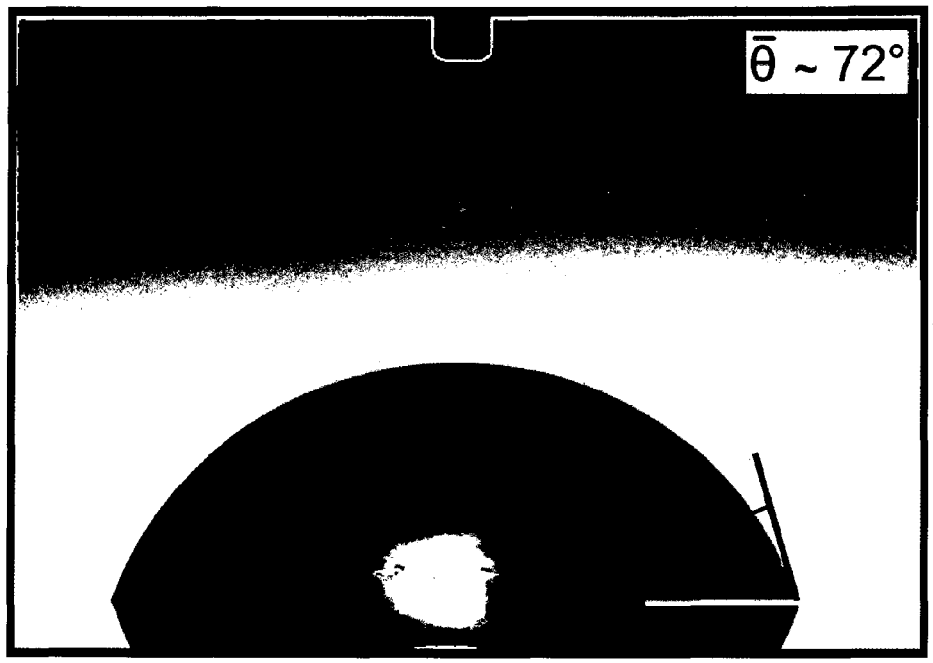
FIGS. 3 *a*) and *b*) depict, respectively, a potential transformation of a hydrophilic base material according to a process in which no chemical modification of the surface takes place, and a material resulting therefrom which has a superhydrophobic contact angle, according to embodiments of the invention.
Figure 3:
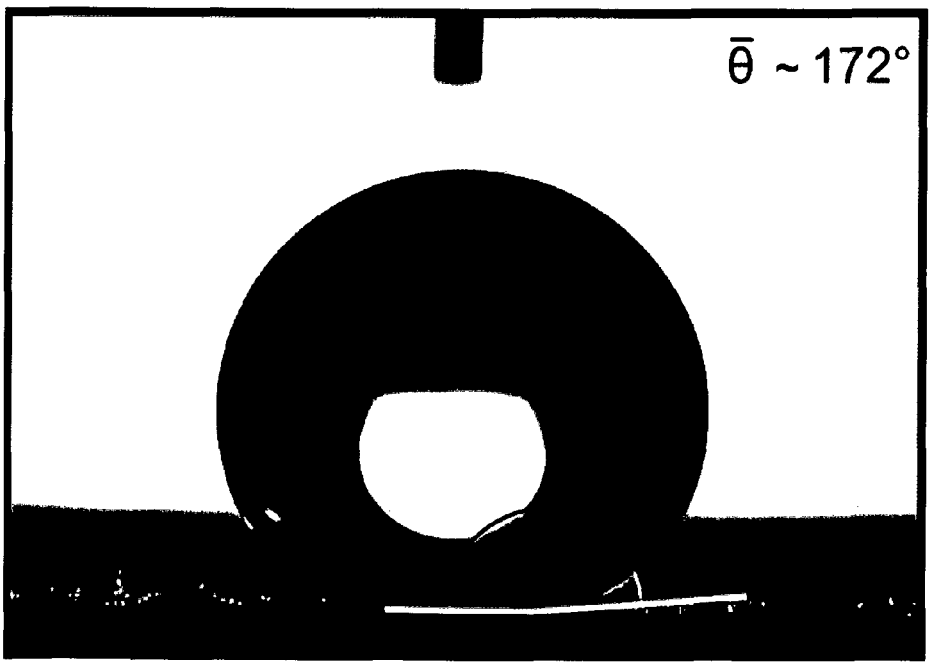

In fact, hydrophobic substances are frequently lipophilic at the same time. Surprisingly, however, the molded body has an extremely unusually high hydrophobicity, and, at the same time, also extremely unusually high lipophilicity. The wettability of the molded body by nonpolar liquids, such as oils and polar water could hardly be higher. Contact angles distinctly less than 10° for n-hexadecane and greater than 170° for water, as FIG. 3 depicts, are close to the greatest possible physical distinction. Here, other sorbents have a clearly less favorable behavior, which is suggested by the water absorption of all other sorbents. Of course, initially, absorbers and mineral absorbers are actually hydrophilic. Their surface can be raised into the hydrophobic range, although not into the superhydrophobic range, at least for short periods, by means of elaborate processes. Q. F. Wei, R. R. Mather, A. F. Fotheringham, and R. D. Yang. Evaluation of nonwoven polypropylene oil sorbents in marine oil-spill recovery. Marine Pollution Bulletin, 46 (6): 780-783, 2003, shows that even polymer mats made from slightly hydrophobic polypropylene still absorb a certain amount of water, even if this is also relatively small. Unlike these mats, which only retain a very small amount of oil due to their felt-like design, oil, which is adsorbed onto the nanostructured film without residue, is adhered to. Nor does repeatedly immersing a surface wet with oil multiple times result in rinsing out the oil. As well, due to the enormous hydrophobicity, enormous waves should not result in the penetration of water or rinsing out of the oil.

In a further embodiment, the molded body is brought into contact with the mixture to be separated by immersing the molded body in the mixture to be separated or the latter is applied directly on the molded body.

In one particular embodiment, the mixture to be separated is a visibly heterogeneous mixture of a nonpolar liquid and a polar liquid or an emulsion of a nonpolar liquid in a polar liquid. An emulsion is defined as a finely distributed mixture of two normally immiscible liquids without visible demixing.

An embodiment of present invention also concerns an application of the process for separating a nonpolar liquid from a polar liquid as an absorption technique for layers of oil on water surfaces, where the oil can be removed from the contaminated water, whether fresh or salt water, even where there are waves, by means of intelligent oil suspension or oil suction devices, so-called oil skimmers. Due to the enormous hydrophobicity and the complete oil retention, enormous swells should also not result in the penetration of water or rinsing out of the oil. The process is also suitable for the purification of bodies of water or for the removal of oil from waste water or for reprocessing in purification plants. As well, the process can be utilized for processing coolant after extended lifetimes by removing oil from coolant liquids. The process is also used in filter technology for filter applications, where emulsions are directly applied to the molded body and the nonpolar liquid is adsorbed onto the nano-structured surface.

An embodiment of the invention has the advantages referred to in the following. Dispensing with mold inserts with a geometrically predetermined structure requires only a nominal technical outlay. Due to its simplicity, the method according to an embodiment of the invention is easily scalable and hence suitable for mass production.

The products of the process according to an embodiment of the invention have surface structures, which, to date, are only able to be achieved by means of the present process. In particular, it was able to be shown in trials that hence an increase in the contact angle by up to 100° is possible.

One advantage in the application is that it is less costly. By immersing the molded body, the nonpolar liquid is selectively adsorbed onto its nanostructured surface.

The nonpolar liquid can be separated distinctly more easily from the molded body in order then to be disposed of, than is the case with the absorbents known from the prior art.

A further advantage of an embodiment of present invention is the high degree of difference in the wettability of the molded body by nonpolar liquids and polar liquids. In parallel to the high degree of repulsion of the polar liquid, which does not allow any polar liquid to be taken up, in particular, the nonpolar liquid is adsorbed and retained without residue. Even immersing a surface wet with nonpolar liquid multiple times does not result in the nonpolar liquid being rinsed out.

The process according to an embodiment of the invention is depicted schematically in FIG. 1. According to FIG. 1 a), in a particularly preferred embodiment of the first process step a), a polymer film 20 made from polycarbonate (PC) is placed between a first plate 11 and a second plate 12. Here, the first plate 11 has a higher degree of adhesion in comparison with the polymer film 20 because of its rough surface, while the second plate 12, due to its polished surface, has a lesser degree of adhesion to the polymer film 20. Here, both plates 11, 12 are then heated to a temperature above $T_g$ so that the application of a compression force F squeezes the softened polymer into the roughness of the first plate 11 so that a composite 21 forms from the first plate 11 with the polymer film 20' squeezed into it, which is then demolded.

According to FIG. 1b), in a particularly preferred embodiment of the second process step b), a third plate 13, with a mean roughness $R_a'$ from 1 μm to 20 μm and a mean roughness depth $R_z'$ from 30 μm to 100 μm, is produced by exposure to sandblasting 30 on one side of a prepared plate 10.

Process step c) is depicted in FIG. 1c) and, thereby, the actual molding step in the process according to the invention. For this purpose, the third plate 13 is placed against the composite 21 created in process step a) from the first plate 11 and the polymer film 20' squeezed into it as a forming insert plate, without the third plate 13 touching the composite 21 at this stage. Here, the third plate 13 is then heated to a temperature above $T_g$ so that the composite 21 itself is not heated. Once the hot third plate 13 comes into contact with the pressed polymer film 20' from the composite 21 as a forming insert plate under the impact of a force F, the polymer from the pressed polymer film 20' partially penetrates into the existing roughened areas of the third plate 13.

According to FIG. 1 d), in a fourth process step d), the other surface of the polymer film 20' squeezed into the first plate 11, facing the third plate, is structured by a relative movement v between the first plate 11 from the composite 21 and the third plate 13 serving as a forming insert plate. Here, it is critical that the pressed-in polymer film 20' located in the composite 21 with the first plate 11 and, therefore, also taken along by the relative movement, continues to remain soft during the demolding process and is thus extended lengthwise. In this way, a modified composite 21' is formed, which incorporates the desired molded body. Due to the parameter set selected (see above), the demolding process here results in an essentially residue-free demolding (extraction), whereby consistent, fine polymer filaments are drawn which can be seen in FIG. 2a). Due to their geometric shape, these structures simulate the lotus effect, wherein the characteristic crater structure can also be seen here in FIG. 2b).

A variation of the fourth process step d) is depicted in FIG. 1e), in which another parameter set has been selected, which results in the polymer film being torn apart. FIG. 2c) shows that this creates fine craters, on the upper edge of which there are very small polymer filaments. These structures facilitate a high degree of adhesion of the molded polymer film, particularly with water, as a function of the concentration of the craters, together with the concentration of the polymer filaments located on the upper edge of the craters.

FIG. 2d) depicts a further superhydrophobic surface with a further parameter set resulting in craters, on the upper edge of which there are longer polymer filaments, which result in a moderate degree of adhesion of the molded polymer film, particularly with water.

FIG. 3 shows that superhydrophobic contact angles are obtained with the present process, even for hydrophilic base materials, such as, here, polycarbonate (PC), without the requirement for chemical modification of the surface. FIG. 3a) shows how a drop forms a contact angle of approximately 72° on a hydrophilic surface made from polycarbonate.

With a structuring realized using the process according to the invention, a molded body was obtained, which has superhydrophobic characteristics on its now structured surface, without treatment using chemical substances for this purpose. As depicted in FIG. 3b), these are apparent, in particular, in the observed contact angle of approximately 172°.

Figure 4:
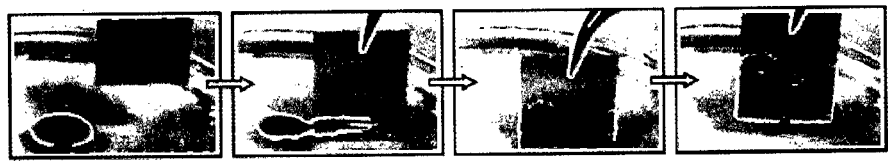
FIG. 4 depicts absorption of the nanostructured film before, during, and after its immersion in a beaker filled with an oil/water mixture, according to an embodiment of the invention.

FIG. 4 depicts scans of the nanostructured film before, during and after their immersion in a glass beaker filled with an oil/water mixture. The water is repelled, while the oil is selectively adsorbed onto the film.

Figure 5:
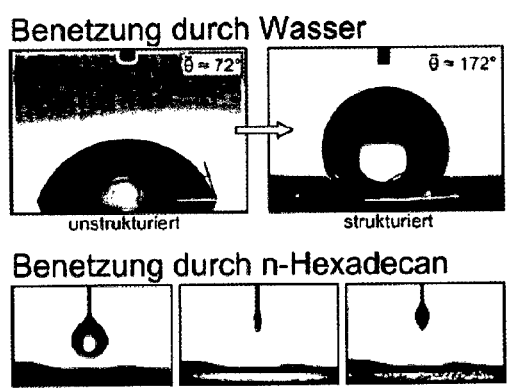
FIG. 5 depicts an investigation of the wetting behavior of water and n-hexadecane.

FIG. 5 depicts the analysis of the wetting behavior of water and n-hexadecane. The structured polymer film becomes water repellant due to the application of the structuring process. Added n-hexadecane, however, spreads on the structured polymer film and wets this completely. Contact angles of distinctly less than 10° were measured for n-hexadecane and over 170° for water, which are close to the greatest possible physical distinction.

Figure 6:
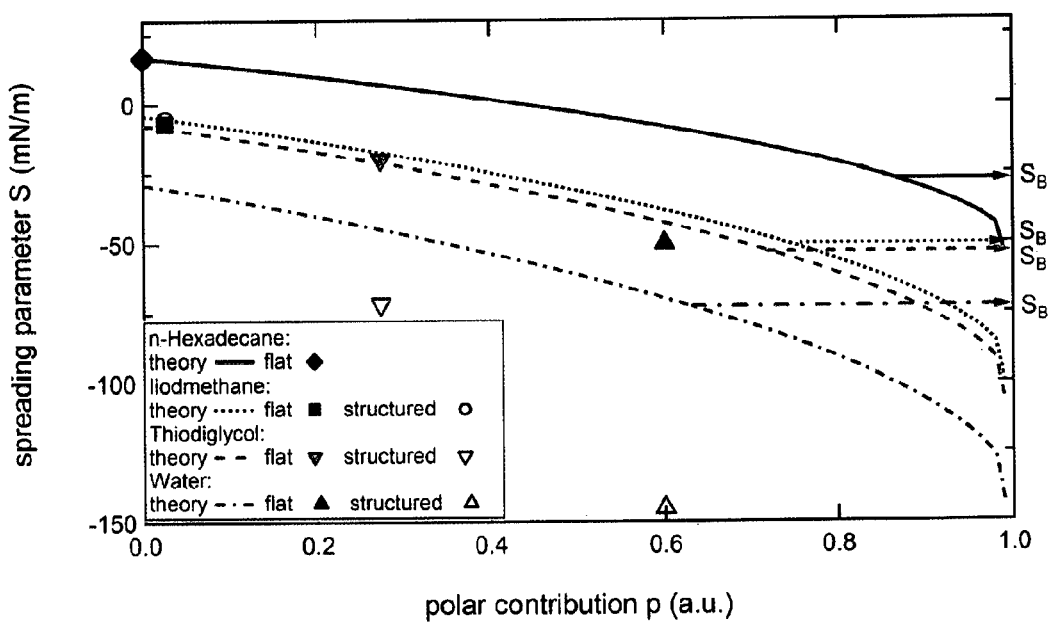
FIG. 6 is a graph of a spreading parameter as a function of the polar components of the surface tension.

FIG. 6 depicts the spreading parameter as a function of the polar components of the surface tension. The theoretical spreading parameters (lines) are shown for 4 different surface tensions. Data measured for the unstructured polycarbonate film: filled-in symbols (diiodomethane: ■, thioglycol: ▼ and water: ▲); for the nanostructured polycarbonate film: the corresponding unfilled symbols, except for diiodomethane: o. The theoretical value of the spreading parameter for n-hexadecane on the unstructured polycarbonate film is marked by a lozenge ♦.

Exemplary Embodiment 1:

For the separation by means of the superhydrophobic film, oil colored with oil-based paint was placed in a glass beaker with water. A film was then immersed in the oil/water mixture and was drawn out again. The experiment was performed with various nonpolar liquids (n-hexadecane and "Total Azolla ZS 10" hydraulic oil). As can be seen in FIG. 4, the oil is adsorbed by the nanostructured film. The colored oil rises above the water level. On removing the film, the oil is retained on the structured film by the filaments and hence is separated from the water. The water is almost solely repelled. An oil uptake of up to 150 ml/m2 was measured, namely with "Total Azolla ZS 10".

Exemplary Embodiment 2:

In this exemplary embodiment, an emulsion of orange-colored oil in blue-colored water was applied to an inclined nanostructured film and an unstructured film. The emulsion applied does not demix on the unstructured surface in the time during which it runs down on the film. The oil wets the unstructured surface and the remainder of the emulsion continues to slide on the film without demixing. This proceeds otherwise with the nanostructured film, on which the emulsion demixes since the oil is adsorbed and is confined by the nanofilaments, while the water drips off. As a result, the water is purified.

For the surface tension of the unstructured polycarbonate, a value of $Y_{SV}$=46.78 mN/m was measured, with a clear prevalence of the dispersive interactions (46.76 mN/m and 0.02 mN/m).

FIG. 6 depicts the spreading parameter of the unstructured polycarbonate film subject to the polar component for various surface tensions. The selected surface tensions correspond to the liquids, which are listed in FIG. 7. The spreading parameter, and hence also the wettability, decrease with the increase in the surface tension of the liquid. Interestingly, the polarity proportion affects the spreading parameter still more noticeably. With an increase in the polar interactions conversely to the dispersive interactions, the spreading parameter decreases exponentially. The distribution of the dispersive and polar components has a massive impact on the unstructured polycarbonate.

The spreading parameters for diiodomethane, thioglycol and water were calculated by introducing the measured static contact angle into Young's equation [9]. The solution to the equation gave a value for $y_{SL}$. These were calculated in accordance with the equation for determining the spreading parameters and were added in FIG. 4B (squares according to color: diiodomethane: red, thiodiglycol: green, water: blue). Interestingly, the calculated data conform to the theoretical values (lines) very well. The theoretical spreading parameters for n-hexadecane are also shown by a brown lozenge. The fact that all data points are located far above the spreading parameters for the limiting condition Sb shows that all tested liquids wet the unstructured polycarbonate film.

The spreading parameters of the tested liquids were measured analogously (circles) for the nanostructured substrate (ySV=122.65 mN/m; 63.73 mN/m and 58.92 mN/m). Interestingly, the changes in the spreading parameters corresponded to the polar component of the surface tension. The spreading parameter of the quasi-nonpolar diiodomethane has increased slightly, wherein the spreading parameter for the liquids with higher polarity, i.e. thiodiglycol and water, decreased in comparison with the values in regard to the unstructured polycarbonate film. With an increase in the polar contribution, the change in respect of the spreading parameter became greater. The spreading parameters for thiodiglycol and water, in fact, are below the corresponding spreading parameter for the limiting condition $S_b$ and hence the unstructured film is clearly in an unwettable state. Consequently, the quasi-nonpolar liquids wet the nanostructured film even more than the polar liquids were repelled. As a result, the nonpolar oil tends to wet the nanostructured film, whereas polar liquids, such as water are repelled. This enables the separation of oil/water by the nanostructured film.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for producing a molded body, the method comprising:
  providing a composite, the composite including a first plate having a polymer film pressed into a surface of the first plate;
  providing a third plate, the third plate including roughened areas on at least parts of one or more surfaces thereof, the roughened areas having a mean roughness $R_a$ from 1 μm to 30 μm and an averaged roughness depth $R_z$ from 20 μm to 100 μm,
  placing the third plate opposite the pressed-in polymer film without the third plate touching the composite; then
  heating the third plate to a temperature above the glass transition temperature $T_g$ of the polymer of the pressed-in polymer film without heating the composite and without the heated third plate coming into contact with the surface of the pressed-in polymer film, whereby the polymer of the pressed-in polymer film at least partially penetrates into the roughened areas of the third plate, and
  structuring the surface of the pressed-in polymer film facing the third plate by a relative movement which removes the third plate from the first plate while the pressed-in polymer film remains soft and is thus extended lengthwise, thereby forming a modified composite that comprises the molded body.

2. The method of claim 1, wherein the composite is created from the first plate with the pressed-in polymer film pressed into the surface of the first plate by introducing a polymer film between the first plate and a second plate, the first plate having a higher degree of adhesion with respect to the polymer film as compared to the second plate then heating both the first and second plates to a temperature above the glass transition temperature $T_g$, of the polymer of the polymer film whereby the polymer of the polymer film is softened, and squeezing the polymer film by applying a compression force on the first plate to form the composite of the pressed-in polymer film with the first plate.

3. The method of claim 1, wherein the roughened areas are created by treatment of at least one surface of an untreated third plate by particle impact.

4. The method of claim 3, wherein the roughened areas are created by sandblasting at least one part of the at least one surface of the untreated third plate.

5. The method of claim 1, wherein roughened areas are created on at least part of the one or more surfaces of the third plate, which have a mean roughness $R_a'$ from 1 μm to 20 μm and an averaged roughness depth $R_z'$ from 30 μm to 100 μm.

6. The method of claim 1, wherein the surface of the pressed-in polymer film facing the third plate is structured by completely removing the pressed-in polymer film from the third plate while the third plate is heated.

7. The method of claim 1, wherein the surface of the pressed-in polymer film facing the third plate is structured by parts of the pressed-in polymer film which are not a component of the modified composite remaining adhered to the third plate, which comprises the desired molded body, by tearing the pressed-in polymer film from the still heated third plate.

8. The method of claim 1, wherein one or more of the first plate, a second plate, and the third plate is designed in the form of a roller.

9. A molded body, produced by the method of claim 1, comprising an at least partially superhydrophobic surface having a crater structure, wherein polymer filaments are formed on the upper edges of the craters.

10. The molded body of claim 9, wherein the craters have a mean diameter from 2 μm to 250 μm and a height from 1 μm to 500 μm, and
  wherein the polymer filaments have a length from 0.5 μm to 200 μm.

11. A method for separating at least one nonpolar liquid from at least one polar liquid, the method comprising:
  separating, with the molded body of claim 9, the at least one nonpolar liquid from the at least one polar liquid.

12. The method of claim 11, wherein, upon the molded body coming into contact with a mixture to be separated, the mixture to be separated comprising the at least one nonpolar liquid and the at least one polar liquid, only the nonpolar liquid is adsorbed on the at least partially superhydrophobic surface of the molded body.

13. The method of claim 11, wherein separating the at least one nonpolar liquid from the at least one polar liquid comprises at least one of separating oil layers on water surfaces, purifying bodies of water, removing oil from waste water, and filtering.

* * * * *